Dec. 6, 1966
J. A. HASTINGS
3,290,565
GLASS ENCLOSED, PASSIVATED SEMICONDUCTOR WITH CONTACT MEANS OF ALTERNATE LAYERS OF CHROMIUM, SILVER AND CHROMIUM
Filed Oct. 24, 1963
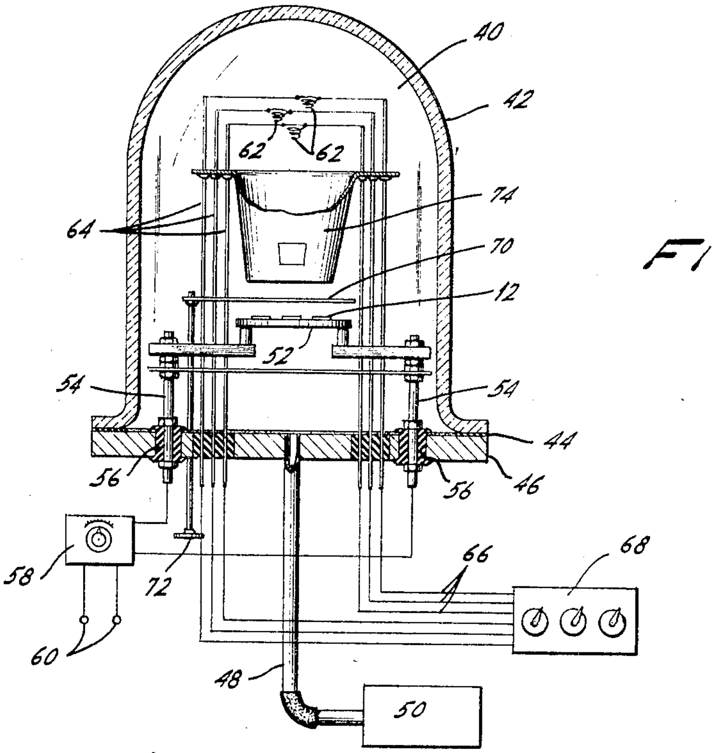
FIG. 1.
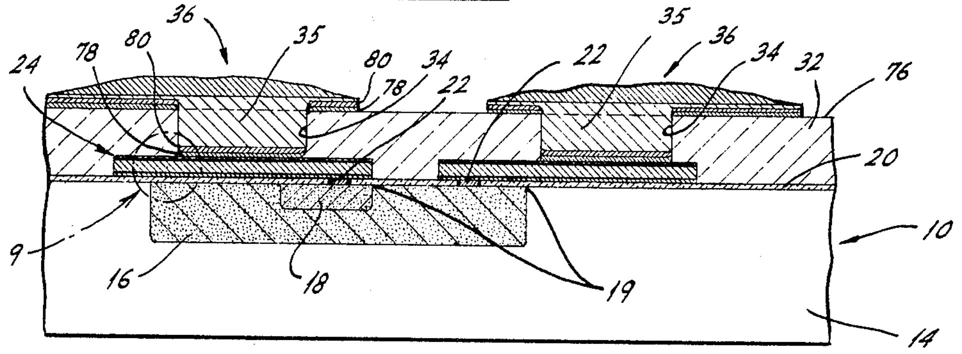
FIG. 2.
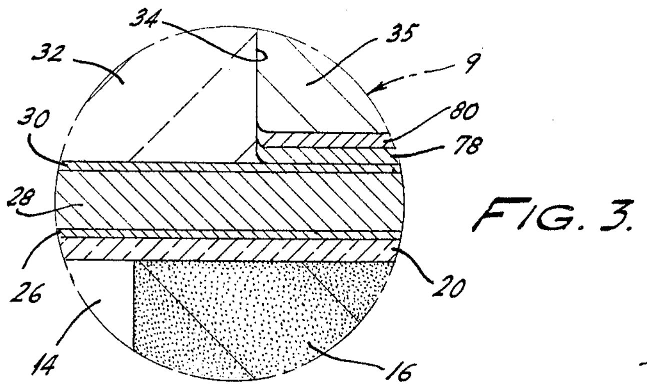
INVENTOR.
JOSEPH A. HASTINGS
BY Stanley A. Zeglaw
ATTORNEY 3,290,565
Patented Dec. 6, 1966

3,290,565

GLASS ENCLOSED, PASSIVATED SEMICONDUCTOR WITH CONTACT MEANS OF ALTERNATE LAYERS OF CHROMIUM, SILVER AND CHROMIUM

Joseph A. Hastings, Havertown, Pa., assignor to Philco Corporation, Philadelphia, Pa., a corporation of Delaware Filed Oct. 24, 1963, Ser. No. 318,590
5 Claims. (Cl. 317—234)

This invention relates broadly to a method of glass-encapsulating metallic films and more particularly to a novel and improved method of and means for hermetically encapsulating the metallized contact system of glassed semiconductor devices.

While the invention has broader application it will be described in connection with its use in the fabrication of planar, silicon semiconductor devices.

It has long been established that the presence of an oxide over the surface of a silicon planar semiconductor device considerably reduces its sensitivity to environmental contamination. This method of passivation, however, while making the device considerably more resistant to contamination has not eliminated the need for hermetic seals.

One technique which has been proposed for hermetically sealing such devices, and one which introduces a minimum of size constraint on the finished package is to encapsulate the active side of the semiconductor device in a layer of glass hermetically bonded to the planar oxide. A method of accomplishing this is to vapor deposit the desired thickness of glass over the oxide passivated surface. The glass acts effectively to seal any pin holes, cracks, or crevices in the silicon oxide preventing contaminants from reaching the underlying surface.

However, in order successfully to apply the glass sealing technique to the encapsulation of semiconductor devices a unique contact system is required which affords electrical accessibility to active regions of the encapsulated device while permitting the formation of a stable hermetic seal.

A further requirement is that the method of fabricating such a system be compatible with current semiconductor technology for the mass production of such devices.

The metal comprising the system must be strongly adherent to silicon and its oxide and to the glass encapsulating media. In this connection it should be noted that if the glass forming the seal is not mechanically adherent to the contacts, subsequent processing and/or high temperature storage will tend to disrupt the seal permitting contamination and destruction of the semiconductor device. The metal comprising the contact system must also alloy with crystalline silicon in order to provide good ohmic connection, must not degrade device reliability by oxide penetration and must contribute a minimum of electrical resistance, in its function as an interconnection between active regions of the device and external connections.

Accordingly, it is an object of this invention to provide a novel and improved contact system, and a method of forming same, for use with silicon semiconductor devices of the "glassed" planar type which fulfills each of the aforesaid requirements.

It is another object of the invention to provide a novel and improved method and means for hermetically encapsulating silicon semiconductor devices.

A still further object of the invention is the provision of a method and means for hermetically encapsulating in glass a thin metallizing film of high electrical conductivity.

These and other objects and advantages of the invention will be more readily understood by reference to the following detailed description and drawing, in which:

FIGURE 1 illustrates one form of apparatus for practicing the method teachings of the invention;

FIGURE 2 is a greatly enlarged fragmentary sectional view of a glass-encapsulated planar semiconductor device constructed in accordance with the instant invention; and FIGURE 3 is a very greatly enlarged schematic view of the encircled area shown in FIGURE 2 identified by the numerical designation 9, showing details of the contact structure.

One metal which immediately suggests itself for a candidate for the contact material is aluminum. Although aluminum is highly favored for its advantageous properties, in many applications it has significant shortcomings, which lead to mechanical and electrical failures of devices incorporating aluminum in their contact systems when such devices are exposed to the high temperatures characteristic of glass sealing processes. Aluminum reacts at elevated temperatures with silicon dioxide resulting in migratory penetration of the oxide overlay and shorting of the junctions. The possibility of failure from such penetration is increased by the need to keep the oxide layer thin to avoid a serious problem from thermal mismatch between the silicon and silicon dioxide.

Since the ultimate reliability of the device is dependent upon the effectiveness of the encapsulating means and its interaction with the contact system and since this in turn is dependent on factors such as outlined above, it is necessary, in achievement of the desired reliability, to provide a contact system of exceptional stability and one, which while forming a hermetic seal with both glass and silica, produces no degradation of the device's characteristics even under extremely adverse environmental conditions.

In accomplishment of these ends and in avoidance of the reliability-degrading aspects of the aluminum metallizing system, there has been developed a novel three-layer contact construction of chromium-silver-chromium. This laminar system has advantages equivalent to those which are available when using aluminum, but is not plagued by the above enumerated shortcomings. This three layer system has been found to meet all of the diverse requirements previously mentioned and is uniquely compatible with its glass-encapsulating environment.

It is also possible to use this triple layer contact in conjunction with a unique surface-preparation process hereinafter described in detail to provide an extremely low-resistance ohmic connection to crystalline silicon. Tests run on wafers having the three layer contact system after stored for one hour at 900° C. disclosed no degradation. The silver layer fulfills the requirement of low electrical resistance while the chromium permits hermetic bonding to the encapsulating media and silicon passivating layer.

To facilitate understanding of the invention it will be described in connection with the hermetic encapsulation and metallizing of a silicon double-diffused planar transistor 10 schematically illustrated in FIGURE 2.

Since the invention is not concerned with the active regions, per se, of the semiconductor device, or their manner of formation, those features will be only briefly described.

Transistors of the planar type are generally simultaneously fabricated by the thousands from a single wafer 12 (FIGURE 1) of low resistivity silicon, about the diameter of a small coin. Individual transistor chips 14 (FIGURE 2) are then scribe-cut from the wafer after their mass fabrication in wafer form. The base 16 and emitter 18 are produced by conventional techniques, the junctions 19 being protected, along their line of surface termination, by a thermally grown oxide overlay 20.

To establish electrical contact with the transistor the oxide layer 20 overlying the diffused zones 16 and 18 is selectively etched, prior to contact evaporation, to provide cuts 22 communicating with active regions 16 and 18 of the device. In particular accordance with the invention, contact lands 24 of composite laminar structure consisting of alternate layers of chromium 26, silver 28 and chromium 30, as clearly seen in FIGURE 3, are then deposited in the manner hereinafter described in detail. This unique contact construction permits hermetic encapsulation of the device and provides for low resistance electrical connection between the active regions 16 and 18 and external connections. The active side of the unit, inclusive of the contact lands 24 is then overlaid with a vapor-deposited coating of glass 32. Following this cuts 34 are made through the glass to the lands 24 and external electrodes 36 are provided.

The chromium forms a tenaciously adherent bond with the silica 20 and the encapsulating glass 32.

With reference to FIGURE 1, there is shown one form of apparatus for carrying out the metallizing phase of the process in particular accordance with the method teachings of the invention. The apparatus comprises a vacuum chamber 40 defined by a bell jar 42 hermetically seated, by means of gasket 44, to a bed plate 46. Communicating with chamber 40 is an exhaust system comprising tubulation 48 connected to a vacuum pump 50. Positioned within the chamber is a substrate heater 52 carried by electrically conductive support columns 54 hermetically sealed to, and electrically insulated from, the bed plate by insulative grommets 56. The substrate heater is connected, through a variac 58, to terminals 60 communicating with an external source of power, not shown. Toward the top of the bell jar there is disposed a trio of tungsten basket coils 62 suspended between electrically conductive support columns 64. The columns are connected, through terminals 66, to a selectively adjustable variac 68. Interposed between the substrate heater 52 and the evaporation coils 62 is a shutter mechanism 70 movable, through externally positioned control knob 72, into interfering position between these members, and a focussing collar 74.

An important requirement for satisfactory bonding of chromium to silicon is that the silicon surface exposed by the oxide cuts be as free of oxide as is practicable. One method of achieving the desired oxide-free surface is to subject the device, immediately prior to the evaporation phase of the process, to a hydrofluoric acid etch to remove any latent oxide residue which has formed during prior processing. Following this there is vapor deposited into the contact cuts a metallic overlay of aluminum and silver.

This step, which immediately precedes the chromium-silver-chromium deposition phase of the process serves the dual purpose of insuring stable ohmic connection to the exposed silicon and in providing a metallurgical barrier between the chromium constituent of the contact and the silicon. While chromium itself does not interact with silicon at the temperatures normally experienced in glass deposition, there is produced at those elevated temperatures certain chrome-silver intermetallics which can result in shorting of the junctions. In avoidance of this problem a layer of silver is interposed between the silicon and chromium. The aluminum forms with the silver and silicon a ternary eutectic mixture having a melting point of approximately 535° C. which acts, on heating of the substrate during glassing of the device, to wet or alloy with the silicon, producing good ohmic connection. The quantity of aluminum is sufficiently low that only microalloying occurs. The silver is present in much large quantity and forms a silver-silicon eutectic having a melting point of about 830° C. which is unaffected by glassing temperatures and the small quantity of aluminum present.

A preferred practice is to place wafers 12, in which contact cuts have been provided, and with the photo resist [e.g. Kodak Photo Resist (KPR)] contact-cut pattern still intact, on the substrate heater 52 and to vapor deposit onto the wafer and into the cuts the aluminum-silver metallic overlay. As noted the aluminum serves to provide low resistance ohmic contact to the silicon substrate, the silver forming a metallurgical barrier between the silicon and subsequently deposited chromium and additionally forming a low resistance, electrically conductive bonding bridge between the silicon and contact lands. One satisfactory proportioning of charge in accomplishment of the aforementioned end is to use 25 mg. of aluminum and 400 mg. of silver. These charges are respectively sequentially vapor deposited onto the wafer while maintaining the wafer-supporting substrate 52 at a temperature of approximately 150°C.

The wafers, following this preliminary treatment, are removed from the evaporator and the KPR and excess material removed using trichloroethylene. The wafers at this point are ready for contact metallization.

To produce a laminar contact structure of the type contemplated by the instant invention it is desirable to use an evaporator equipped with three evaporator coils. One exemplary formulation of charge is to use two separate 500 mg. charges of chromium, and a 1000 mg. charge of silver. Sequential vaporization of the chromium-silver-chromium, using a 5½" coil-to-work-surface spacing, will produce a composite laminar structure comprised of a layer of silver approximately 3000 A. thick, bounded by layers of chromium approximately 1500 A. thick. Each of the charges may be sequentially evaporated independently of the other and after depletion of the previous charge, or they may be phased-in by beginning a succeeding evaporation before the previous one is terminated. Both forms of vaporization have produced satisfactory results. A typical evaporation schedule is to vaporize chromium for 3.5 minutes, silver for 6 minutes ending with a 3.5 minute vaporization of chromium.

On completion of vaporization the upwardly presented face of the wafer 12 is completely metallized. The desired contact pattern is photolithographically delineated by conventional techniques using, for example, standard KPR resist material. One satisfactory procedure for achieving the desired contact configuration is that disclosed in U.S. application Serial No. 212,603, filed July 26, 1962, and assigned to the assignee of the instant invention.

After the contact pattern has been generated in the resist overlay the top layer of chromium, in those regions unprotected by the resist, is removed by subjecting it to a 1 to 10 second etch in concentrated hydrochloric acid followed by a 30 second rinse in deionized water. The silver underlying this layer is next removed by immersing the wafer, for about 30 seconds, in a 55% ferric nitrate solution maintained at about 250° C., followed by a rinse in deionized water. Before removing the final layer of chromium it is desirable to bake the KPR resist for about 2 minutes at 180° C. The wafer is then immersed, using stainless steel tweezers, in a 1:1 sulphuric acid solution maintained at 80° C. This etch is almost instantaneous and insures minimal impairment of the underlying silica.

To complete the hermetic seal the contact lands and wafer are encapsulated in a vapor deposited protective layer of glass which bonds directly to the planar oxide and confronting chromium surfaces of the contact. This produces a chemically inert, extremely stable, hermetic seal. By this arrangement a thin metal film of high electrical conductivity can be hermetically sealed in an encapsulating matrix of glass without fear of impairment of the unit resulting from poor mechanical adherence between the metal contacts and glass.

A preferred procedure for achieving glass encapsulation is that disclosed in U.S. application Serial No. 311,-868, filed September 26, 1963, and assigned to the assignee of the present invention. That procedure, briefly described, comprises the step of adding a tungsten-containing vapor, to that of the ordinary high-silica borosilicate glass normally used. Particularly excellent results have been obtained using a tungsten-containing vapor of that high-silica borosilicate glass made by Corning Glass Works of Corning, New York, sold under the trademark "Pyrex," which comprises, by weight, approximately 80% silica, 14% boric oxide and minor amounts or traces of soda, alumina, etc., the best proportion of tungsten being of the order of 16–20% by weight of the glass. This glass coating is highly compatible with the chromium surfaced portions of the contact and with the planar oxide and produces an improved hermetic seal of an order of reliability several times greater than that obtainable using existing encapsulating structures.

Glassing of the wafer is carried out in a vacuum of about $10^{-5}$ or $10^{-6}$ torr. One procedure is to use a tungsten filament, and to heat a charge of Pyrex glass to a temperature of approximately 2200° C. by passing electric current through the filament. The wafer during this stage is advantageously held at a temperature of about 600°–700° C.

It has been found that condensate of glass vaporized in this manner contains about 16–20% of tungsten in addition to a major amount of silica and much smaller amounts or traces of boric oxide and other materials.

As previously mentioned the glass coating produced by this method is uniquely compatible with the silicon substrate and the laminar chromium-silver-chromium contact and can safely be built up to substantial thicknesses to minimize capacitive coupling between lower and upper contact lands.

It will also be appreciated that because of the high ambient temperatures which are a concomitant of the glassing process it is necessary to provide a contact metallizing system which is not only hermetically bondable to glass, silica, and crystalline silicon but one which is metallurgically inert at the elevated temperatures required for glass deposition. The metallizing system comprised of chromium-silver-chromium has been found to be such a system. If an improved measure of reliability is desired the silicon exposed by the contact cuts may be pretreated with an aluminum-silver overlay in the manner previously described.

To provide electrical access to the glass-encapsulated lands 24, holes 34 approximately 2 mils in diameter are etched through the glass. Because of the chemical activity of glass etchants, such as hydrofluoric acid, it is required to use a metal mask for hole delineation. Conveniently, a chrome-silver or chrome-gold mask may be employed for this purpose. Chromium used alone presents too porous a surface and consequently is desirably overlaid with a coating of gold or silver. This combination also appears to aid subsequent etching operations. The mask is vapor deposited onto the glass and then selectively removed at the etch-locations using standard photolithographic techniques. The chromium and silver are removed in the uncoated areas in the manner previously described, exposing the glass substrate.

One formulation found suitable as an etchant for tungsten-containing glass was a 1:1 solution of hydrofluoric acid. To each through a two micron thick layer of glass takes from 1 to 3 minutes using an ultrasonorator. Following hole formation the mask is chemically removed.

Top lands are then provided by vapor depositing onto the glass surface 76 and exposed surface portions of the lower contact lands, a layer 78 of chromium overlaid by a layer 80 of nickel. The chromium is tenaciously adherent to the glass surface and readily adheres to the lower land to provide the desired low-resistance, ohmic connection. The nickel overlay is used to promote solderability. Because of the hole size, reliance cannot be placed on the vapor-deposited metal to form a connecting bridge along the vertical walls of the hole between the metal deposited on the surface of the glass and that deposited on the floor of the hole. To insure the requisite electrical interconnection between the deposited layers of metal and to provide a substantially continuous surface for subsequent soldering, the capillary size holes 34 are filled by a slug 35 formed by plating the wafer in an electroless nickel bath of sodium hypophosphite and palladium chloride. The metal only plates out on metal-coated surfaces. The metal builds up in the hole filling it and completing the electrical connection between upper and lower contact lands. The final step in the process is to dip solder the unit in a soft solder bath comprised for example of tin and lead to complete the electrode formation.

In summary, I have discovered that contacts comprised of alternate layers of chromium, silver, and chromium uniquely meet the requirements of a glass-encapsulating system. Moreover, it has been found that the vapor deposition of chromium-silver-chromium results in a stable contact structure which is readily bondable to vacuum-deposited glass permitting hermetic encapsulation of an electrically conductive film of silver in a matrix of glass.

By employment of this metallizing system thousands of individual silicon semiconductive devices can be hermetically encapsulated simultaneously at the device level by use of straightforward vapor deposition techniques.

While a preferred embodiment of the invention has been depicted and described, it will be understood by those skilled in the art that the invention is susceptible, in both method and apparatus aspects, of changes and modifications without departing from the essential concepts thereof, and that such changes and modifications are contemplated as coming within the scope of the appended claims.

I claim:

1. A planar semiconductor device, comprising: a silicon semiconductive body; a layer of silica overlying surface portions of said body; a body of glass overlying said silica and hermetically bonded thereto; and laminar contact means comprised of a layer of silver disposed between layers of chromium, ohmically connected to confronting surface portions of said body and hermetically bonded to confronting surface portions of said silica and glass hermetically to encapsulate said device.

2. A glassed semiconductor device comprising: a silicon semiconductive body of given conductivity type having a region therein of opposite conductivity type forming a junction terminating at a surface thereof; a silica-passivating layer overlying surface-terminating portions of said junction; laminar contact means comprised of a layer of silver sandwiched between layers of chromium, ohmically connected to confronting surface portions of said region and hermetically bonded to surface portions of said silica and glassing media hermetically to encapsulate said device.

3. A silicon semiconductive body hermetically encapsulated by a composite structure comprising an adherent body of glass and laminar contact means comprised of a layer of silver disposed between layers of chromium hermetically sealed to said glass and said body.

4. A silicon semiconductive body having an active region therein forming a junction terminating at a surface thereof, a passivating layer of silica overlying said junction; and said body being hermetically sealed by a composite structure comprising a layer of glass adherent to said silica, and contact means embedded therein composed of alternate layers of chromium, silver and chromium, ohmically connected to said active region and hermetically bonded to said silica and glass.

5. A semiconductor device comprising: a silicon semiconductive body having an active region therein forming a junction terminating at a surface thereof; a passivating layer of silica overlying said junction; and means sealing said device comprising a layer of glass adherent to said silica and contact means composed of alternate layers of chromium, silver and chromium hermetically sealed to said glass and ohmically connected to said active region by a metallic interface of aluminum and silver.

References Cited by the Examiner

UNITED STATES PATENTS

| | | | |
|---|---|---|---|
| 2,694,168 | 11/1954 | North et al. | 317—234 |
| 2,973,466 | 2/1961 | Atalla et al. | 317—240 |
| 2,973,571 | 3/1961 | Meyering | 29—194 |
| 3,200,310 | 8/1965 | Carman | 317—234 |

JOHN W. HUCKERT, *Primary Examiner.*

M. EDLOW, *Assistant Examiner.*